(12) United States Patent
Lee

(10) Patent No.: US 9,351,411 B2
(45) Date of Patent: May 24, 2016

(54) FASTENING MECHANISM FOR ELECTRONIC DEVICE

(71) Applicants: LITE-ON ELECTRONICS (GUANGZHOU) LIMITED, Guangzhou (CN); LITE-ON TECHNOLOGY CORPORATION, Taipei (TW)

(72) Inventor: Li-Hsin Lee, Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 97 days.

(21) Appl. No.: 14/464,766

(22) Filed: Aug. 21, 2014

(65) Prior Publication Data

US 2015/0085439 A1    Mar. 26, 2015

(30) Foreign Application Priority Data

Sep. 25, 2013 (CN) .......................... 2013 1 0441425

(51) Int. Cl.
*G06F 1/16* (2006.01)
*H05K 5/02* (2006.01)
*H05K 7/14* (2006.01)

(52) U.S. Cl.
CPC ............ *H05K 5/0204* (2013.01); *H05K 7/1471* (2013.01)

(58) Field of Classification Search
USPC ........... 248/573, 125.1, 205.1, 157, 422, 343, 248/309.1, 905, 550, 638, 429, 346.03, 248/133; 361/679.21, 679.58, 679.43, 361/679.4, 679.06, 679.36, 679.33, 679.22, 361/679.27, 679.55, 679.08, 679.17, 361/679.09, 679.47, 679.32, 679.01, 361/679.26, 679.31; 312/223.2, 327, 111, 312/223.1, 404, 405, 334.1, 351.11, 249.8, 312/333; 165/121, 67; 439/676, 131, 571, 439/607.24, 630, 373; 345/163, 1.3, 173, 345/55, 205; 455/571.1, 90.3
See application file for complete search history.

(56) References Cited

U.S. PATENT DOCUMENTS

| 8,944,478 | B2 * | 2/2015 | Pullmann ............... E05B 15/022 292/201 |
| 9,130,375 | B2 * | 9/2015 | Yeh ........................ H02J 7/0044 |
| 2010/0081043 | A1 * | 4/2010 | Huang ................ H01M 2/1066 429/96 |
| 2014/0084865 | A1 * | 3/2014 | Yeh ........................ H02J 7/0044 320/110 |

* cited by examiner

*Primary Examiner* — Hung Duong
(74) *Attorney, Agent, or Firm* — Li & Cai Intellectual Property (USA) Office

(57) ABSTRACT

A fastening mechanism for an electronic device is provided. The electronic device is embedded into a fixed object, and has a display portion and an embedding portion. The fixed object is formed with a receiving space. A connection box is mounted in the receiving space. The fastening mechanism includes a fastening unit, an elastic unit and a transferring bracket. The fastening unit is movably disposed in the embedding portion of the electronic device. The fastening unit has a hook. The elastic unit abuts the fastening unit. The transferring bracket is disposed in the connection box, and has a frame and a blocking portion. When the embedding portion of the electronic device is disposed in the frame of the transferring bracket, the hook engages the blocking portion to fix the electronic device to the fixed object.

10 Claims, 9 Drawing Sheets

FASTENING MECHANISM FOR ELECTRONIC DEVICE

BACKGROUND OF THE INVENTION

1. Field of the Invention

The present disclosure relates to a fastening mechanism; in particular, to a fastening mechanism for in-wall electronic devices.

2. Description of Related Art

Conventional in-wall touch panels can be applied to various intelligent household appliances, machines or equipment. The in-wall touch panel can be embedded in walls, main bodies, or other fixed objects. In-wall touch panels are often fastened by using strong magnets and hooks to ensure a secure fixture.

However, strong magnets are liable to produce electromagnetic interference (EMI), thereby affecting the operation of the touch panel. Hooks are liable to lose elasticity after repeated assemblies thereby reducing their locking effectiveness. Moreover, after the hooks have become ineffective, attachment relies solely on the strong magnets. When strong magnets attach to each other, the connectors may be poorly connected, severing signal and power supply connections and causing damage to the connectors.

SUMMARY OF THE INVENTION

The object of the present disclosure is to provide a fastening mechanism for an electronic device, which can effectively and securely fasten the electronic device to a fixed object and solve the problems of electromagnetic interference and poor connection between connectors.

In order to achieve the aforementioned objects, the present disclosure provides a fastening mechanism for an electronic device. The electronic device is embedded in a fixed object and has a display portion and an embedding portion. The fixed object has a receiving space. A connection box is disposed in the receiving space. The fastening mechanism includes a fastening unit movably disposed in the embedding portion of the electronic device and having at least one hook; an elastic unit abutting the fastening unit; and a transferring bracket disposed in the connection box and having a frame and at least one blocking portion protrudingly disposed at inner walls of the frame. When the embedding portion of the electronic device is disposed in the frame of the transferring bracket, at least one of the hooks is locked and fastened to one of the blocking portions such that the electronic device is fastened to the fixed object.

In order to achieve the aforementioned objects, the present disclosure provides a fastening mechanism for an electronic device. The electronic device has an embedding portion. The fixed object has a receiving space. The fastening mechanism includes a fastening unit movably disposed in the embedding portion of the electronic device and having at least one hook; an elastic unit abutting the fastening unit; and at least one blocking portion disposed at the fixed object. When the embedding portion of the electronic device is disposed in the receiving space, at least one of the hooks is locked and fastened to one of the blocking portions such that the electronic device is fastened to the fixed object.

The present disclosure has the following advantages. The fastening unit and the elastic unit combine to form an elastic actuation module such that the elastic actuation module can move in predetermined paths of motion, attaching and fastening the electronic device to the fixed object. Not only is secure fastening obtained, but also the problem of electromagnetic interference resulting from using strong magnets and the problem of poor connection between connectors are solved.

In order to further the understanding of the present disclosure, the following embodiments are provided along with illustrations to facilitate the disclosure of the present invention.

DETAILED DESCRIPTION OF THE PREFERRED EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings.

First Embodiment

Figure 1:
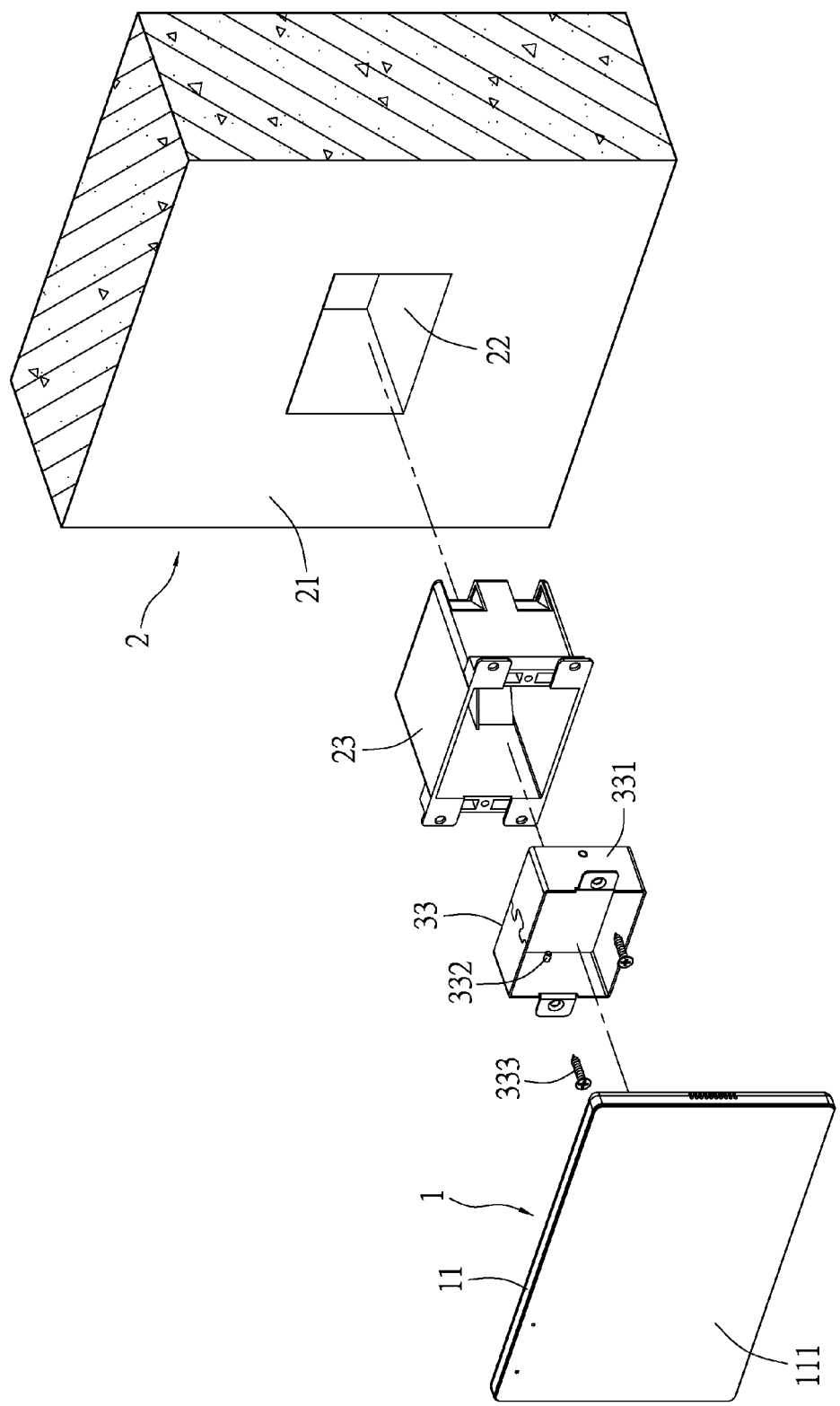
FIG. 1 shows an exploded view of a fastening mechanism for an electronic device according to the first embodiment of the present disclosure (1)
Figure 2:
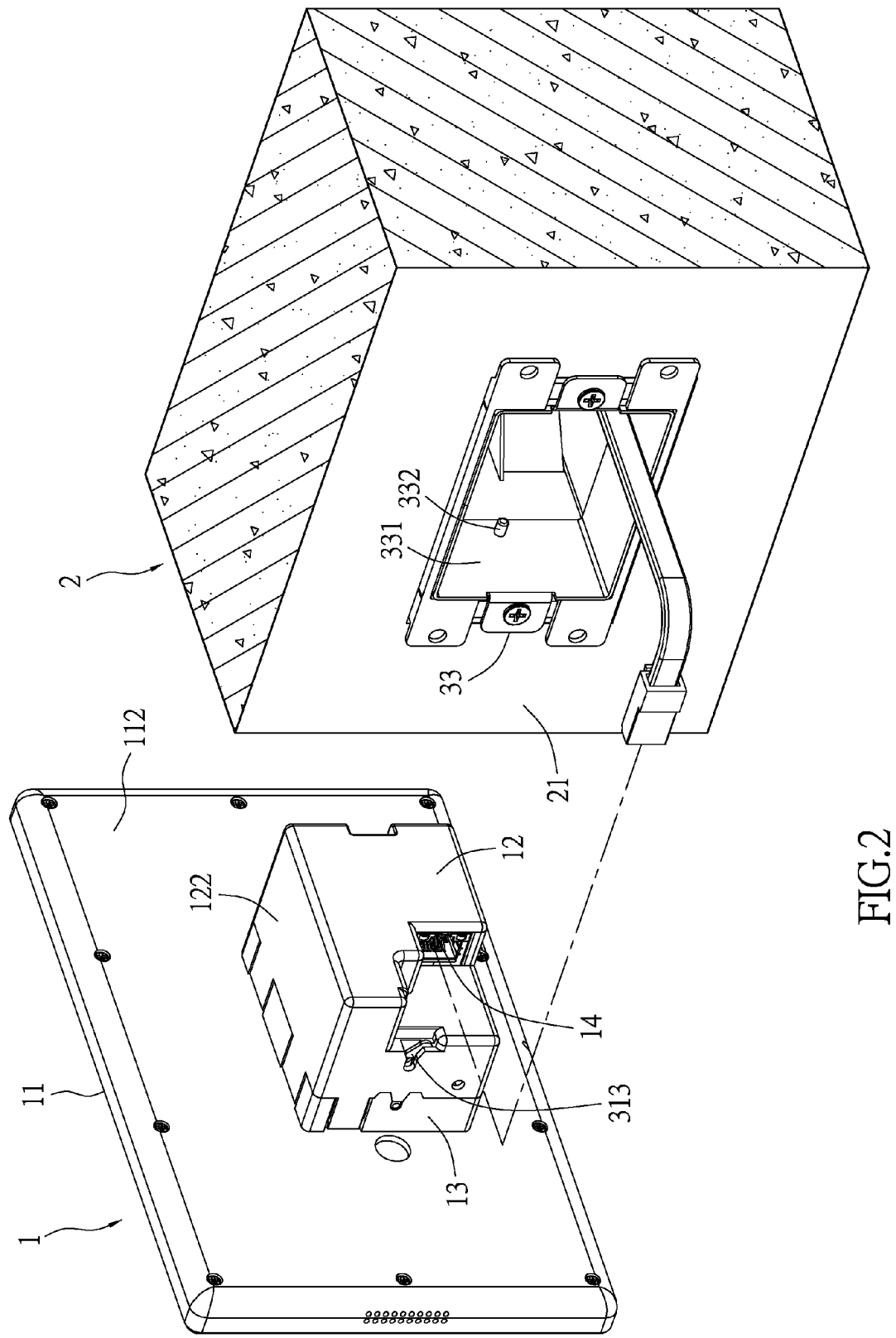
FIG. 2 shows an exploded view of a fastening mechanism for an electronic device according to the first embodiment of the present disclosure (2)
Figure 3:
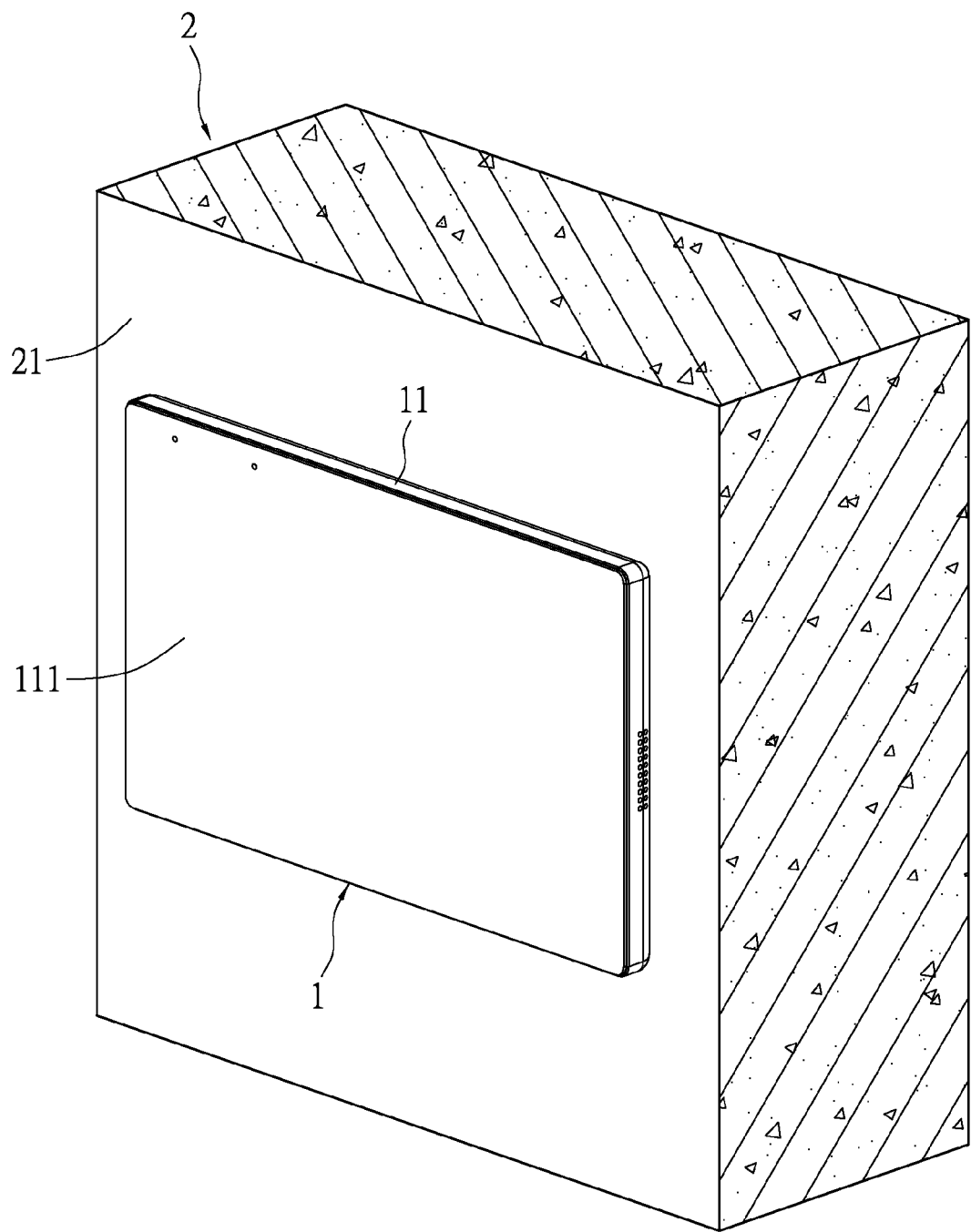
FIG. 3 shows a perspective view of an electronic device assembled to a fixed object by an assembled fastening mechanism according to the first embodiment of the present disclosure.

Referring to FIG. 1 to FIG. 3, the present disclosure provides a fastening mechanism for an electronic device. The electronic device can be an in-wall touch panel, a display apparatus, a control apparatus or other electronic devices. The electronic device in the present embodiment is exemplified as an in-wall touch panel. The electronic device 1 may be embedded in a fixed object 2 such as a wall or a main body.

The electronic device 1 has a display portion 11 and an embedding portion 12. The display portion 11 has a front face 111 and a rear face 112. The front face 111 can be a display face, touch control face, etc. The embedding portion 12 is connected to the rear face 112 of the display portion 11. The electronic device 1 (such as an in-wall touch panel) is similar to conventional arts, and the present disclosure does not limit the form and structure of the electronic device 1. For example, the electronic device 1 does not necessarily have a display portion 11, and may have a control portion, a power portion or other components not detailed herein. The embedding portion 12 of the electronic device 1 has a connector 14 connected to the electric circuits within the electronic device 1. The connector 14 can electrically connect to connectors of other devices such that the electronic device 1 can be electrically connected to other devices for transmitting signals and power.

The fixed object 2 has a fixture face 21 and is recessed to be formed with a receiving space 22. A connection box 23 may be mounted in the receiving space 22 and fixed to the fixed object 2 by screws or other attachments. The display portion 11 of the electronic device 1 is disposed on the fixture face 21 of the fixed object 2. The embedding portion 12 of the electronic device 1 is disposed in the connection box 23. The fastening mechanism 3 (as shown in FIG. 4 and FIG. 5) is disposed between the electronic device 1 and the fixed object 2 for fastening the electronic device to the fixed object 2.

Figure 4:
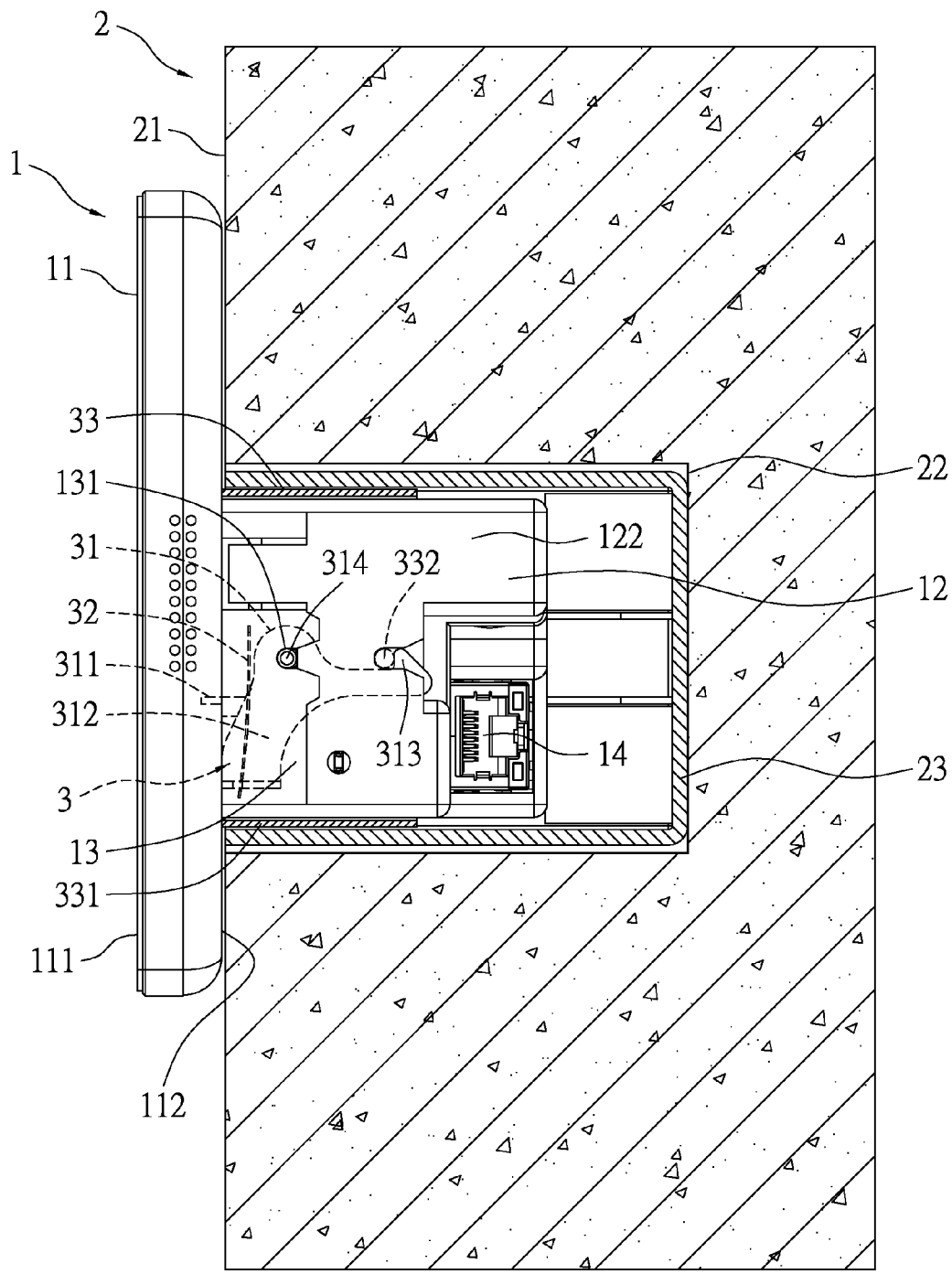
FIG. 4 shows a cross-sectional view of a fastening mechanism assembled to the electronic device according to the first embodiment of the present disclosure.
Figure 5:
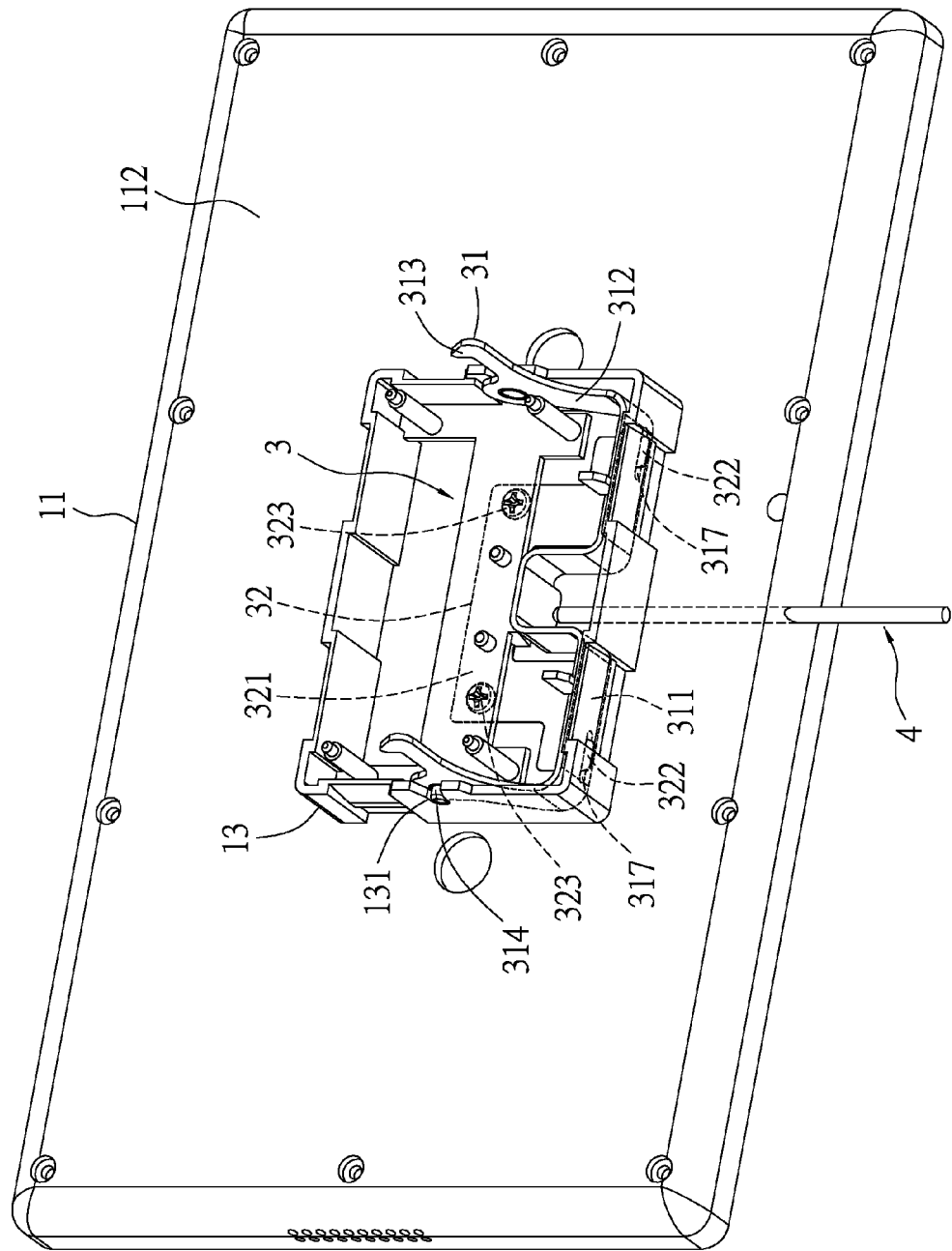
FIG. 5 shows a perspective view of the part of the fastening mechanism assembled to the electronic device according to the first embodiment of the present disclosure.

Referring to FIG. 4 and FIG. 5, the fastening mechanism 3 includes a fastening unit 31, an elastic unit 32 and a transferring bracket 33. The fastening unit 31 may be a metal part such that the material thereof is firm and the dimensions thereof can be accurately controlled. The fastening unit 31 is movably disposed in the embedding portion 12 of the electronic device 1. In the present embodiment, the embedding portion 12 has a cover 122 sleeved around a pivot seat 13. The pivot seat 13 may be fixed to the rear face 112 of the display portion 11 or integrally formed with the rear face 112. In other words, the pivot seat 13 may be formed by extending the pivot seat 13 from the display portion 11 or an independent part joined together with the outer cover 122 to form the embedding portion 12. In the present embodiment, the fastening unit 31 includes a base 311, two arms 312 and two hooks 313. The base 311 may be planar or curvedly bent. The two arms 312 may be formed through extension from two ends of the base 311. The two hooks 313 are formed respectively at the ends of the two arms 312 distal from the base 311. The two arms 312 each have a first pivot portion 314. Each of the first pivot portions 314 may be a pivot shaft or a pivot hole. The first pivot portions 314 of the present embodiment are pivot shafts. Two second pivot portions 131 are formed in the embedding portion 12. The two second pivot portions 131 may be disposed at the pivot seat 13. The two second pivot portions 131 may be pivot holes or pivot shafts. The second pivot portions 131 of the present embodiment are pivot n holes. The two first pivot portions 314 are pivotally connected to the two second pivot portions 131 for rotatably disposing the fastening unit 31 in the embedding portion 12 such that the fastening unit 31 can rotate about the two first pivot portions 314 (which are rotation shafts) and enable the hooks 313 of the fastening unit 31 to selectively lock and fasten to the transferring bracket 33.

The structure of the fastening unit 31 is not limited and can be properly modified. For example, the base 311 can be modified to be a plate or a rod in other forms. The hooks 313 may have other forms. The arms 312 or the hooks 313 may each amount to only one. In other words, the fastening mechanism 3 may fasten the electronic device 1 to the fixed object 2 on a single side. The fastening unit 31 may be pivoted in the embedding portion 12 through other known pivot structures. Additionally, besides being pivoted in the embedding portion 12, the fastening unit 31 may also be disposed to be slidable in an up and down direction or a front and rear direction in the embedding portion 12 of the electronic device 1, likewise enabling the hooks 313 of the fastening unit 31 to selectively lock to the transferring bracket 33.

Figure 6:
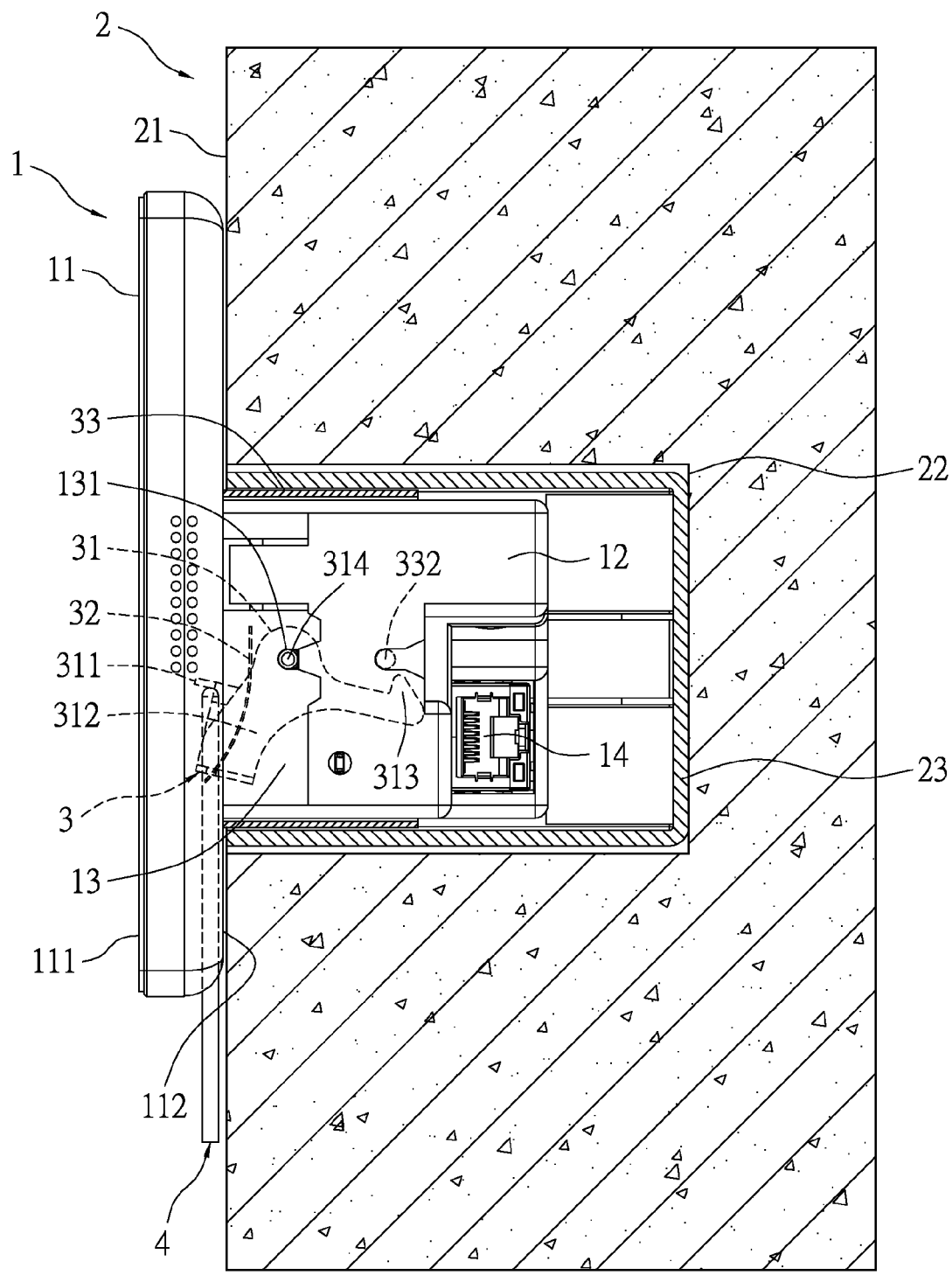
FIG. 6 shows a cross-sectional view of a fastening mechanism assembled to the electronic device in another state according to the first embodiment of the present disclosure.
Figure 7:
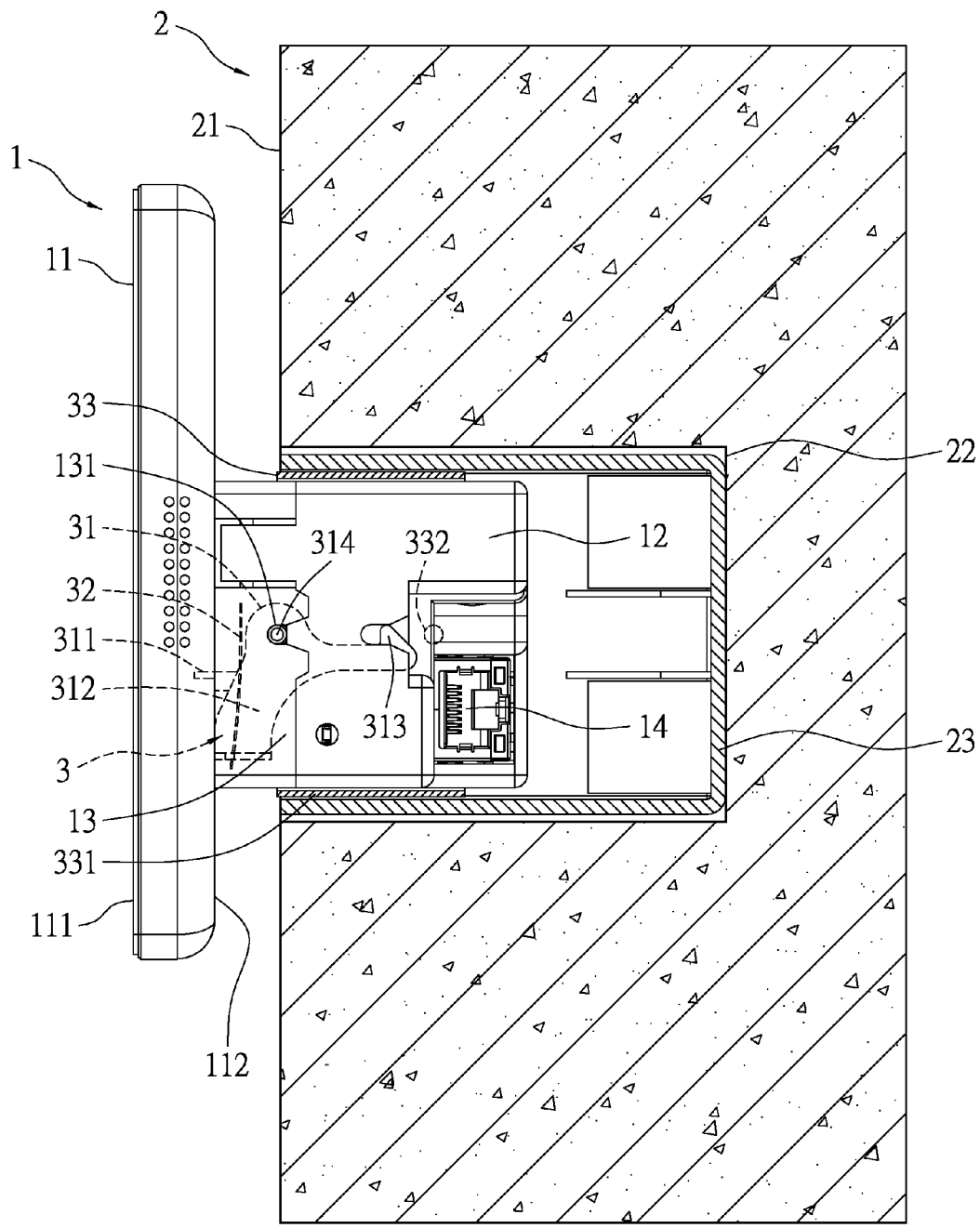
FIG. 7 shows a cross-sectional view of a fastening mechanism assembled to the electronic device in yet another state according to the first embodiment of the present disclosure.

The elastic unit 32 is preferably a plate-shaped spring but is not limited thereto. The elastic unit 32 can have a fixing portion 321 and an abutting portion 322 connected to the fixing portion 321. The fixing portion 321 may be fixed to the rear face 112 of the display portion 11 by screws 323 or other attachments. The abutting portion 322 may abut the base 311 of the fastening unit 31. The present embodiment has two abutting portions 322 respectively inserted into two through holes 317 on two sides of the base 311 of the fastening unit 31 such that the two abutting portions 322 are locked to and abut the two sides of the base 311 of the fastening unit 31. The elastic unit 32 abuts the fastening unit 31 such that the fastening unit 31 and the elastic unit 32 can be combined to form an elastic actuation module, movable along predetermined paths of motion (such as rotation). After deforming due to an external force, the elastic unit 32 (as shown in FIG. 6 and FIG. 7) can drive the fastening unit 31 such that the hooks 313 of the fastening unit 31 respectively lock and fasten to blocking portions 332 of the transferring bracket 33. This design can minimize the amount of space required by the rotation of the elastic actuation module. Additionally, the elastic unit 32 may be a plate-shaped spring which minimizes the space occupied, achieving the effect of downsizing. In another embodiment, the elastic unit 32 may be a compression spring or a torque spring, etc. According to needs, the elastic unit 32 can amount to one, two, or more. The form and structure of the elastic unit 32 is not limited as long as it can resiliently abut the fastening unit 31 such that the hooks 313 of the fastening unit 31 can lock and fasten to the blocking portion 332.

The transferring bracket 33 is disposed in the fixed object 2. In the present embodiment, the transferring bracket 33 is disposed in the connection box 23. The transferring bracket 33 may have a frame 331 and two blocking portions 332. The frame 331 is fixed in the connection box 23 by screws 333 or other attachments. The two blocking portions 332 are respectively protrudingly disposed at two lateral inner walls of the frame 331. The blocking portions 332 may be cylindrically shaped, block-shaped or otherwise shaped. In the present embodiment, the transferring bracket 33 has the two blocking portions 332 disposed correspondingly to the two hooks 313 of the fastening unit 31. If the fastening unit 31 has only one hook 313, then only one blocking portion 332 is required, such that the hook 313 of the fastening unit 31 can lock to the corresponding blocking portion 332. However, the structure of the transferring bracket 33 is not limited, and the way of disposing the blocking portion 332 at the fixed object 2 is not limited. The blocking portion 332 may be attached to the fixed object 2 through the transferring bracket 33, or directly attached to the fixed object 2 or the connection box 23.

When the electronic device 1 is to be combined onto the fixed object 2, the embedding portion 12 of the electronic device 1 can be disposed in the frame 331 of the transferring bracket 33, such that the embedding portion 12 of the electronic device 1 is disposed in the connection box 23 and the receiving space 22 at the same time, and the hooks 313 of the fastening unit 31 are locked and fastened to the blocking portions 332 of the transferring bracket 33 (as shown in FIG. 4), thus restricting the retrieval of the electronic device 1 and fixing the electronic device 1 to the fixed object 2.

When the user intends to remove the electronic device 1, a release tool 4 (as shown in FIG. 5 and FIG. 6) is inserted between the display portion 11 of the electronic device 1 and the fixed object 2 to push a push portion of the fastening unit 31 (the base 311 acts as a push portion in the present embodiment), such that the fastening unit 31 rotates about the first pivot portions 314 (which are rotation shafts). The fastening unit 31 rotates in a clockwise direction, such that the hooks 313 of the fastening unit 31 can disengage from the blocking portions 332 of the transferring bracket 33. By this way, the electronic device 1 can separate from the fixed object 2 and the transferring bracket 33 (as shown in FIG. 7). When the release tool 4 is retrieved, the elastic unit 32 returns to its original shape and drives the fastening unit 31 to rotate in a counter-clockwise direction to return to the original position of the fastening unit 31. Therefore, any mechanism which requires fastening can apply the present disclosure in its design to achieve locking and unlocking in a limited amount of space.

Second Embodiment

Figure 8:
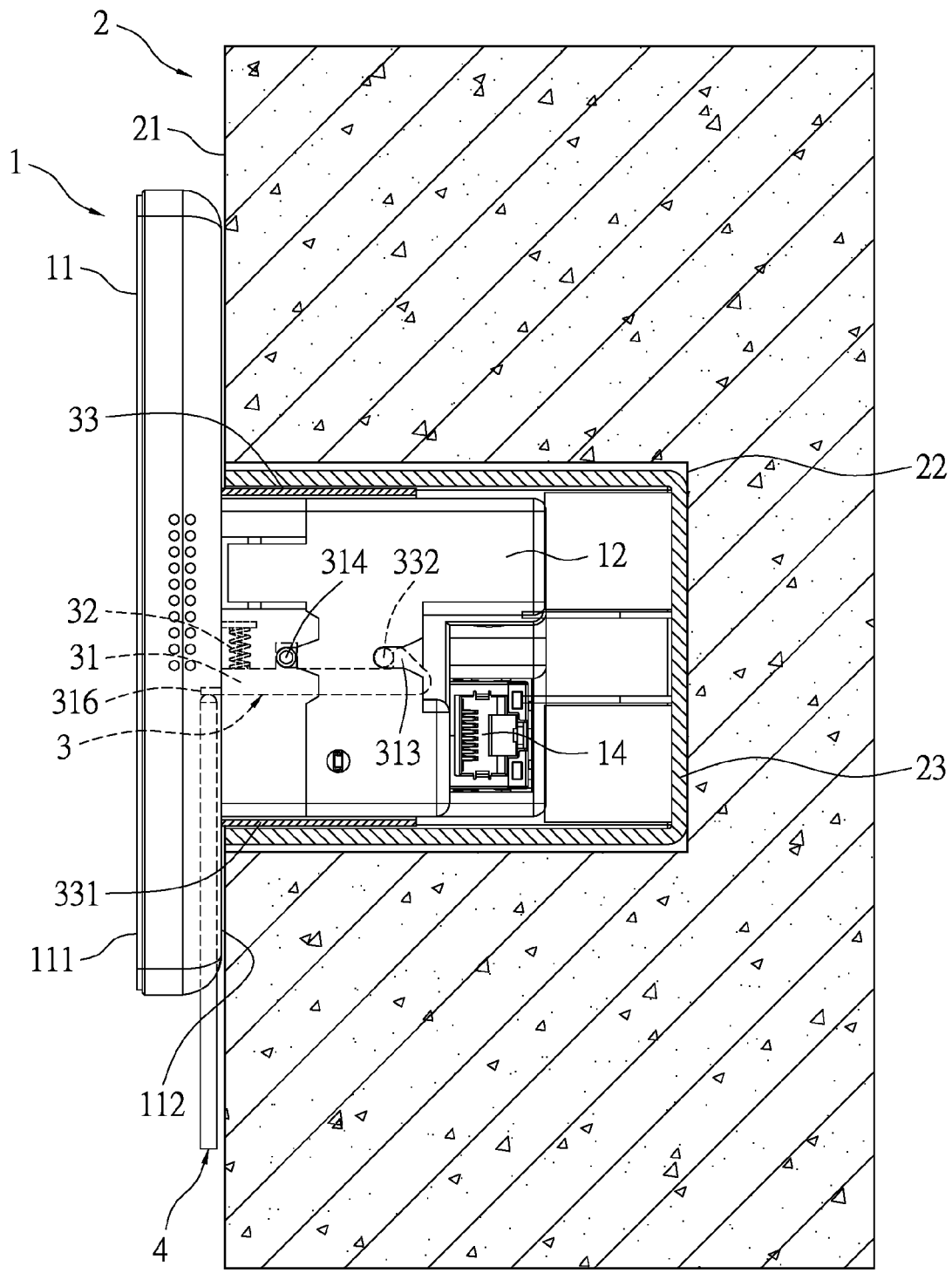
FIG. 8 shows a cross-sectional view of a fastening mechanism assembled to the electronic device according to the second embodiment of the present disclosure.

Referring to FIG. 8, the fastening unit 31 of the fastening mechanism 3 of the present embodiment has a different shape. The fastening unit 31 has hooks 313 and is pivotally disposed in the embedding portion 12 by the first pivot portions 314 such that the fastening unit 31 can rotate about the first pivot portions 314 (which are rotation shafts). In the present embodiment, the elastic unit 32 is a compression spring and is fixed at the rear face 112 of the display portion 11. One end of the elastic unit 32 may abut or be fixed to the rear face 112 or an appropriate position in the embedding portion 12. The other end of the elastic unit 32 may abut or be fixed to the fastening unit 31. The blocking portions 332 may be formed on the transferring bracket 33 or formed directly on the fixed object 2 or the connection box 23. The fastening unit 31 can rotate about the first pivot portions 314 (which are rotation shafts) and the elastic unit 32, deformed under stress, drives the hooks 313 of the fastening unit 31 to selectively lock to the blocking portions 332. When the user intends to take the electronic device 1 out, a release tool 4 is inserted between the display portion 11 of the electronic device 1 and the fixed object 2 to push a push portion 316 of the fastening unit 31, such that the fastening unit 31 rotates in a clockwise direction and the hooks 313 of the fastening unit 31 disengages from the blocking portions 332 of the transferring bracket 33. By this configuration, the electronic device 1 can separate from the fixed object 2 and the transferring bracket 33. The motion and function of the present embodiment is similar to the above embodiment and is not further detailed herein.

Third Embodiment

Figure 9:
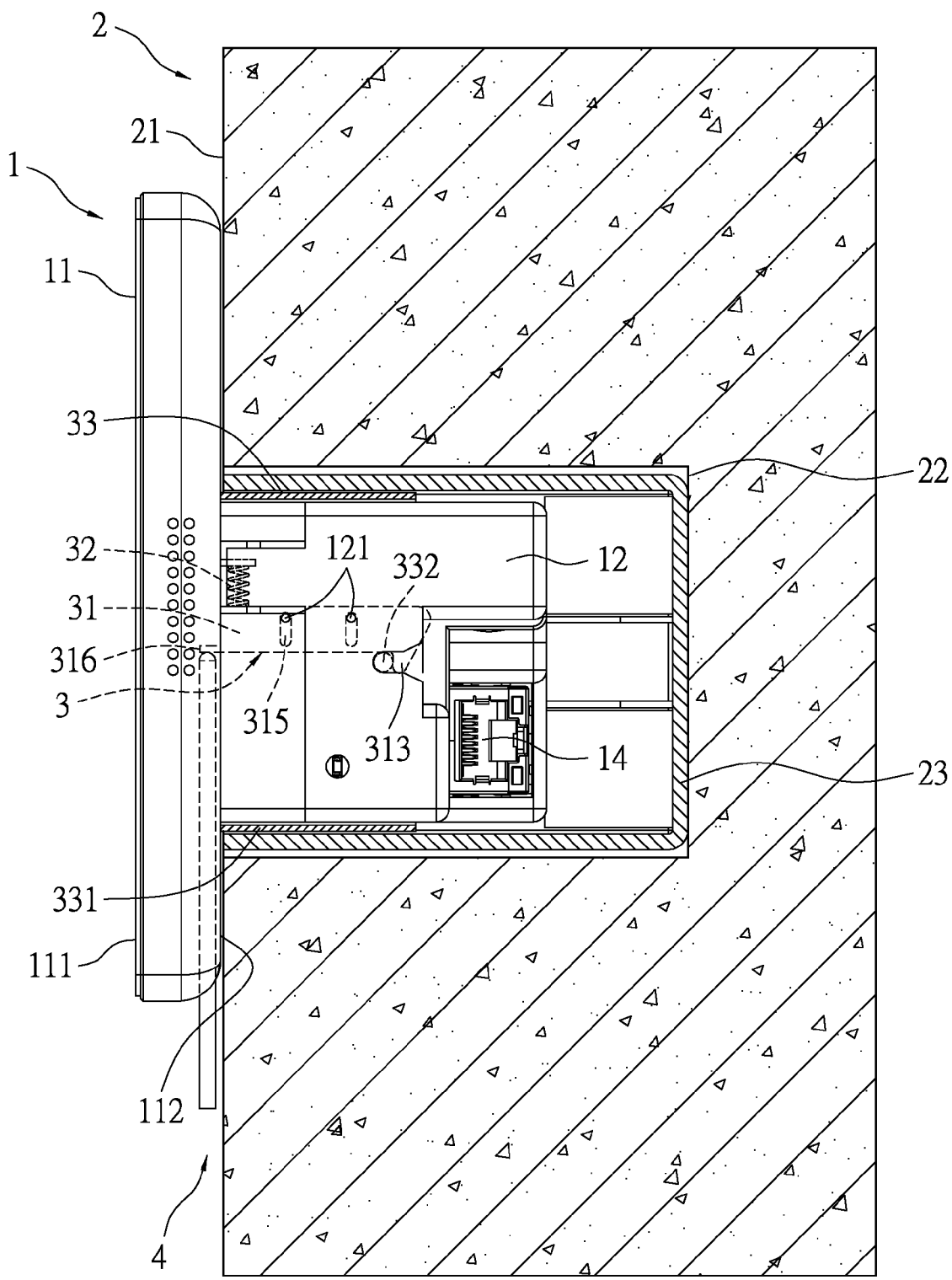
FIG. 9 shows a cross-sectional view of a fastening mechanism assembled to electronic device according to the third embodiment of the present disclosure.

Referring to FIG. 9, the fastening unit 31 of the fastening mechanism 3 of the present embodiment is movably disposed in the embedding portion 12 of the electronic device 1 in an up-and-down sliding manner. Namely, the fastening unit 31 has a guiding groove 315 disposed thereon, the embedding portion 12 has a guiding column 121 arranged therein, and the guiding column 121 slidably engages the guiding groove 315 for guiding the fastening unit 31 to stably slide up and down. The elastic unit 32 abuts the fastening unit 31 such that the hooks 313 of the fastening unit 31 can lock and fasten to the blocking portions 332, thereby fixing the electronic device 1 to the fixed object 2. When the user intends to take the electronic device 1 out, a release tool 4 is used to push a push portion 316 of the fastening unit 31 such that the fastening unit 31 slides upward and the hooks 313 of the fastening unit 31 disengages from the blocking portions 332. By this configuration, the electronic device 1 separates from the fixed object 2.

Therefore, through the fastening mechanism for an electronic device of the present disclosure, the fastening unit and the elastic unit can be combined to form an elastic actuation module such that the elastic actuation module produce motion, thereby producing a predetermined path of motion, which can fix the electronic device to the fixed object, not only obtaining an effective locking strength, but also not requiring any magnets, solving the problem of electromagnetic interference and poor connection between connectors caused by magnets. Moreover, the fastening unit can be selectively pivotally disposed in the electronic device, and the rotating structure can be used in limited space, securely fixing the electronic device to the fixed object.

The descriptions illustrated supra set forth simply the preferred embodiments of the present disclosure; however, the characteristics of the present disclosure are by no means restricted thereto. All changes, alternations, or modifications conveniently considered by those skilled in the art are deemed to be encompassed within the scope of the present disclosure delineated by the following claims.

What is claimed is:

1. A fastening mechanism for an electronic device, the electronic device embedded in a fixed object, the electronic device having a display portion and an embedding portion, the fixed object formed with a receiving space in which a connection box is disposed, and the fastening mechanism comprising:
   a fastening unit movably disposed in the embedding portion of the electronic device and having at least one hook;
   an elastic unit abutting the fastening unit; and
   a transferring bracket disposed in the connection box and having a frame and at least one blocking portion protrudingly disposed at an inner wall of the frame;
   wherein when the embedding portion of the electronic device is disposed in the frame of the transferring bracket, the at least one hook locks and fastens to the at least one blocking portion, thereby the electronic device is fixed to the fixed object.

2. The fastening mechanism for an electronic device according to claim 1, wherein the fastening unit is rotatably disposed in the embedding portion of the electronic device.

3. The fastening mechanism for an electronic device according to claim 2, wherein the fastening unit includes a base and an arm, the arm is formed by extending from the base, the hook is formed on an end of the arm distal from the base, the arm has a first pivot portion, the embedding portion has a second pivot portion arranged therein, and the first pivot portion is pivotally coupled to the second pivot portion.

4. The fastening mechanism for an electronic device according to claim 1, wherein the fastening mechanism is slidably disposed in the embedding portion of the electronic device, the fastening unit has a guiding groove disposed thereon, the embedding portion has a guiding column disposed therein, and the guiding column and the guiding groove are slidably engaged.

5. The fastening mechanism for an electronic device according to claim 1, wherein the elastic unit is a plate-shaped spring having a fixing portion and an abutting portion connected to the fixing portion, the fixing portion is fixed to a rear face of the display portion, and the abutting portion abuts the fastening unit.

6. A fastening mechanism for an electronic device, the electronic device embedded in a fixed object, the electronic device having an embedding portion, the fixed object formed with a receiving space, and the fastening mechanism comprising:
   a fastening unit movably disposed in the embedding portion of the electronic device and having at least one hook;
   an elastic unit abutting the fastening unit; and
   at least one blocking portion disposed at the fixed object;
   wherein when the embedding portion of the electronic device is disposed in the receiving space, the at least one hook locks and fastens to the at least one blocking portion, thereby the electronic device is fixed to the fixed object.

7. The fastening mechanism for an electronic device according to claim 6, wherein the fastening unit is rotatably disposed in the embedding portion of the electronic device, the fastening unit includes a base and an arm, the arm is formed by extending from the base, the hook is formed on an end of the arm distal from the base, the arm has a first pivot portion, the embedding portion has a second pivot portion therein, and the first pivot portion is pivotally coupled to the second pivot portion.

8. The fastening mechanism for an electronic device according to claim 6, wherein the fastening mechanism is slidably disposed in the embedding portion of the electronic device, the fastening unit has a guiding groove disposed thereon, the embedding portion has a guiding column disposed therein, and the guiding column and the guiding groove are slidably engaged.

9. The fastening mechanism for an electronic device according to claim 6, wherein the elastic unit is a plate-shaped spring having a fixing portion and an abutting portion connected to the fixing portion, the fixing portion is fixed to a rear face of the display portion, and the abutting portion abuts the fastening unit.

10. The fastening mechanism for an electronic device according to claim 6, wherein the electronic device has a display portion.

* * * * *